(12) United States Patent
Aiba (10) Patent No.: US 8,303,363 B2
(45) Date of Patent: Nov. 6, 2012

(54) METHOD FOR BONDING GAS BARRIER FILM AND ELECTRONIC DEVICE, AND ELECTRONIC DEVICE AND METHOD FOR PRODUCING SAME

(75) Inventor: Satoshi Aiba, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1 day.

(21) Appl. No.: 12/884,277

(22) Filed: Sep. 17, 2010

(65) Prior Publication Data

US 2011/0068682 A1    Mar. 24, 2011

(30) Foreign Application Priority Data

Sep. 18, 2009 (JP) ................. 2009-216706

(51) Int. Cl.
*H01J 9/24* (2006.01)
(52) U.S. Cl. .......................................... 445/24; 313/506
(58) Field of Classification Search .......... 313/498–512; 445/24–25
See application file for complete search history.

(56) References Cited

U.S. PATENT DOCUMENTS

| | | | |
|---|---|---|---|
| 2004/0056139 A1 | 3/2004 | Shigemura | |
| 2006/0179796 A1* | 8/2006 | Kadota et al. | 53/461 |
| 2009/0072735 A1* | 3/2009 | Tsukahara et al. | 313/512 |
| 2010/0208190 A1* | 8/2010 | Yoshida | 349/160 |

FOREIGN PATENT DOCUMENTS

| | | |
|---|---|---|
| JP | 5-127822 A | 5/1993 |
| JP | 9-129371 A | 5/1997 |
| JP | 10-512104 A | 11/1998 |
| JP | 11-33997 A | 2/1999 |
| JP | 11-58297 A | 3/1999 |
| JP | 2002-48913 A | 2/2002 |
| JP | 2004-107057 A | 4/2004 |
| JP | 2005-183501 A | 7/2005 |
| JP | 2007-30387 A | 2/2007 |
| JP | 2009-21554 A | 1/2009 |
| JP | 2009-94051 A | 4/2009 |
| JP | 2009-172988 A | 8/2009 |
| JP | 2009-172993 A | 8/2009 |
| WO | WO 97/15947 A1 | 5/1997 |

* cited by examiner

*Primary Examiner* — Bumsuk Won
(74) *Attorney, Agent, or Firm* — Birch, Stewart, Kolasch & Birch, LLP (57) ABSTRACT

A method for bonding a gas barrier film and an electronic device, comprising continuously feeding a film composite that contains a gas barrier film having a support and a gas barrier layer, and an adhesive layer; blanking or slitting a part of the film composite to form a wire lead-out part therein; and continuously roll-bonding the film composite to a substrate with an electronic device formed thereon; wherein the feeding of the film composite, the forming of the wire lead-out part and the roll-bonding are carried out through in-line operation.

18 Claims, 3 Drawing Sheets

METHOD FOR BONDING GAS BARRIER FILM AND ELECTRONIC DEVICE, AND ELECTRONIC DEVICE AND METHOD FOR PRODUCING SAME

CROSS-REFERENCE TO RELATED APPLICATIONS

The present application claims the benefit of priority from Japanese Patent Application No. 216706/2009, filed on Sep. 18, 2009, the contents of which are herein incorporated by reference in their entirety.

BACKGROUND OF THE INVENTION

1. Field of the Invention

The present invention relates to a method for bonding a gas barrier film and an electronic device, to a method for producing an electronic device array that includes the bonding method, and to a method for producing an electronic device that includes the production method. The invention also relates to the electronic device produced according to the electronic device producing method.

2. Description of the Related Art

An electronic device such as an organic EL device requires a wire lead-out part or a lead-out wire (e.g., lead pin) running outward from the electronic device substrate.

Heretofore, in case where a lead-out wire is provided between a pair of substrates, a wire lead is fixed to the wire lead-out part previously formed in an electronic device substrate, and at the same time, another substrate in which a hole is previously formed partly in the site corresponding to the wire lead-out part is prepared as a sealing material, and the two are bonded and sealed up one by one (for example, see JP-A 9-129371). However, according to the method, continuous production is impossible, and the method is complicated as requiring a lot of steps; and accordingly, it is desired to simplify the method and to enhance the production efficiency in the method.

On the other hand, recently, the performance level required in electronic device sealing has increased, and it is desired to use a gas barrier film as the sealing material.

However, as compared with conventional sealing materials, a gas barrier film is generally readily damaged and is difficult to use. Therefore, in case where a gas barrier film is used for sealing an electronic device, there is a problem in that a wire lead-out part could hardly be formed in the gas barrier film.

Accordingly, it is anticipated that a method of continuously feeding a gas barrier film and bonding it to an electronic device substrate would be more difficult than a method of using a conventional sealing material; and in fact, that method of using a gas barrier film for the purpose is unknown in the art.

SUMMARY OF THE INVENTION

Taking the above-mentioned problems into consideration, the present inventors have investigated a method of continuously feeding a gas barrier film and bonding it to an electronic device substrate through in-line operation, and thereafter forming a wire lead-out part in the gas barrier film. As a result, the inventors have known that it is difficult to peel the gas barrier film bonding to a wire lead-out part later in the subsequent step, and in addition, the method requires such a superfluous step that is still complicated and is unsatisfactory in point of the production efficiency.

An object of the invention is to solve the above-mentioned problems, and precisely to provide a method for bonding a gas barrier film and an electronic device not damaging the gas barrier film being fed continuously to the system, which method is simple and can attain high production efficiency.

Accordingly, the inventors have assiduously studied for the purpose of solving the above-mentioned problems and, as a result, have found that, when a gas barrier film being fed continuously to the processing system is blanked and/or slit to form a wire lead-out part therein and then the resulting gas barrier film is bonded to an electronic device substrate through in-line operation using rolls, then the above-mentioned problems can be solved, and have completed the present invention. Specifically, the invention having the constitution mentioned below has solved the problems.

[1] A method for bonding a gas barrier film and an electronic device, comprising:
continuously feeding a film composite that contains a gas barrier film having a support and a gas barrier layer, and an adhesive layer,
blanking or slitting a part of the thus continuously fed film composite to form a wire lead-out part therein, and
continuously roll-bonding the film composite thus processed to form a wire lead-out part therein to a substrate with an electronic device formed thereon,
wherein the feeding of the film composite, the forming of the wire lead-out part and the roll-bonding are carried out through in-line operation.

[2] The method for bonding a gas barrier film and an electronic device of [1], wherein the film composite is blanked or slit plural times in the direction perpendicular to the film traveling direction.

[3] The method for bonding a gas barrier film and an electronic device of [1] or [2], wherein the electronic device is an organic EL device.

[4] The method for bonding a gas barrier film and an electronic device of any one of [1] to [3], wherein blanking the continuously fed film composite and then slitting the blanked film composite.

[5] The method for bonding a gas barrier film and an electronic device of any one of [1] to [3], wherein blanking the continuously fed film composite to form therein a wire lead-out part of which the long side is in the direction perpendicular to the film traveling direction is followed by slitting the film composite to form therein a wire lead-out part of which the long side is in the film traveling direction.

[6] The method for bonding a gas barrier film and an electronic device of any one of [1] to [5], wherein the film composite is blanked or slit by introducing a cutting blade thereinto from the side of the gas barrier film of the film composite.

[7] The method for bonding a gas barrier film and an electronic device of any one of [1] to [6], comprising removing the blanked or slit part of the gas barrier film of the film composite prior to the roll-bonding.

[8] The method for bonding a gas barrier film and an electronic device of any one of [1] to [7], wherein the film composite is continuously fed from a roll film composite.

[9] The method for bonding a gas barrier film and an electronic device of any one of [1] to [8], wherein the gas barrier film has a laminate structure of at least one organic layer and at least one inorganic structure alternately laminated on one surface of the support of a thermoplastic resin.

[10] The method for bonding a gas barrier film and an electronic device of any one of [1] to [9], wherein the film composite further contains a protective film, and the gas barrier film, the adhesive layer and the protective film are laminated in that order.

[11] The method for bonding a gas barrier film and an electronic device of [10], wherein the film composite is partially slit by introducing a cutting blade thereinto from the side of the gas barrier film of the film composite to reach the inside of the protective film.

[12] The method for bonding a gas barrier film and an electronic device of [11], comprising removing a film composite protective film after forming the wire lead-out part and prior to the roll-bonding.

[13] The method for bonding a gas barrier film and an electronic device of [12], wherein the film composite protective film is removed just before the roll-bonding.

[14] The method for bonding a gas barrier film and an electronic device of any one of [1] to [13], comprising curing the adhesive layer after the roll-bonding.

[15] The method for bonding a gas barrier film and an electronic device of [14], wherein the adhesive layer is cured by heating.

[16] A method for producing an electronic device array, comprising:
continuously feeding a film composite that contains a gas barrier film having a support and a gas barrier layer, and an adhesive layer,
blanking or slitting a part of the thus continuously fed film composite to form a wire lead-out part therein,
continuously roll-bonding the film composite thus processed to form a wire lead-out part therein to a substrate with a plural number of electronic devices formed thereon, and
curing the adhesive layer,
wherein the feeding of the film composite, the forming of the wire lead-out part and the roll-bonding are carried out through in-line operation.

[17] A method for producing an electronic device, comprising:
continuously feeding a film composite that contains a gas barrier film having a support and a gas barrier layer, and an adhesive layer,
blanking or slitting a part of the thus continuously fed film composite to form a wire lead-out part therein, and
continuously roll-bonding the film composite thus processed to form a wire lead-out part therein to a substrate with an electronic device formed thereon, and
curing the adhesive layer,
wherein the feeding of the film composite, the forming of the wire lead-out part and the roll-bonding are carried out through in-line operation.

[18] The method for producing an electronic device of [17], wherein the substrate has a plural number of electronic devices formed thereon and an electronic device array is produced after the curing of the adhesive layer, and the method further comprises cutting the electronic device array into individual electronic devices.

[19] An electronic device produced by the electronic device production method of [17] or [18].

[20] The electronic device of [19], wherein the device is an organic EL device.

The method for bonding a gas barrier film and an electronic device of the invention is simple and attains high production efficiency, not damaging the gas barrier film being fed continuously to the processing system. The method for producing an assembly of a plural number of electronic devices of the invention does not require fitting of a lead-out wire after sealing even in a case where one sheet of gas barrier film needs to be divided into plural gas barrier films of an electronic device size in the width direction thereof, and therefore according to the method, plural electronic device substrates can be sealed up all at once in the entire width direction of the gas barrier film.

BRIEF DESCRIPTION OF THE DRAWINGS

In the drawings, 5 is a blanking unit, 6 is a slitting unit, 7 is an unnecessary gas barrier film winding unit, 8 is a protective film winding unit, 9 is a gas barrier film bonding roll, 10 is a film composite, 14 is a gas barrier film, 12 is an adhesive layer, B is a protective film, 30 is a slitting unit, 32 is a rotary blade, 34 is a backup roller, 36 is a shaft, 72 is a rotary blade, 100 is a substrate of an organic EL device array, 101 is a hole, 102 is a part to be wound off, 103 is a wire lead-out part.

BEST MODE FOR CARRYING OUT THE INVENTION

The invention is described in more detail hereinunder. In this description, the numerical range expressed by the wording "a number to another number" means the range that falls between the former number indicating the lowermost limit of the range and the latter number indicating the uppermost limit thereof.

In the invention, "organic EL device" means organic electroluminecent device.

[Method of Bonding Gas Barrier Film and Electronic Device]

The method for bonding a gas barrier film and an electronic device of the invention (hereinafter this may be referred to as the method of the invention) comprises continuously feeding a film composite that contains a gas barrier film having a support and a gas barrier layer, and an adhesive layer, blanking or slitting a part of the thus continuously fed film composite to form a wire lead-out part therein, and continuously roll-bonding the film composite thus processed to form a wire lead-out part therein to a substrate with an electronic device formed thereon, wherein the film composite feeding step, the wire lead-out part forming step and the roll-bonding step are carried out through in-line operation. Preferred embodiments of the method of the invention are described below.

<Film Composite Feeding Step>

The method of the invention includes continuously feeding a film composite that contains a gas barrier film having a support and a gas barrier layer, and an adhesive layer.

In the method of the invention, preferably, the gas barrier film has a laminate structure of at least one organic layer and at least one inorganic structure alternately laminated on one surface of the support of a thermoplastic resin. More preferably, the film composite contains a protective film, and the gas barrier film, the adhesive layer and the protective film are laminated in that order.

Also preferred is an embodiment where the gas barrier layer of the gas barrier film contains any other organic layer.

The gas barrier film in the invention may be constituted according to the description of the paragraphs [0011] to [0030] in JP-A 2009-094051.

(Protective Film)

Preferably, a protective film is formed at least on the entire area of the upper side of the adhesive layer of the film composite from the viewpoint of physically protecting the adhesive layer.

For the substrate of the protective film, usable is any material generally used for protective films, such as PE, PET, PVC, PVA, PMMA, PC, PP, PS, ABS, etc.

(Adhesive)

The adhesive for use for the adhesive layer includes a heat-sealing agent, a thermosensitive adhesive, a pressure-sensitive adhesive, a photosensitive adhesive, etc. The adhesive layer in the invention is for bonding the support and the gas barrier film to the objective body (electronic device panel).

(Form)

The film composite in the invention may be directly fed from a roll thereof, or may be fed after once rolled and then unrolled (to be spread as a film), or that is, the film composite may be used in the invention in any form so far as it is continuously fed to the processing system. Preferably, the film composite in the invention is in the form of a roll from the viewpoint that the method is attained entirely through in-line operation. The film composite in the form of a roll is preferred from the viewpoint of simplifying the procedure of the method.

<Wire Lead-Out Part Forming Step>

The method of the invention includes blanking or slitting a part of the continuously fed film composite to form a wire lead-out part therein.

Preferably in the method of the invention, the film composite is blanked or slit plural times in the direction perpendicular to the film traveling direction from the viewpoint of dividing the bonded substrate.

Also preferably in the method of the invention, a step of blanking the continuously fed film composite to form therein a wire lead-out part of which the long side is in the direction perpendicular to the film traveling direction is followed by a step of slitting the film composite to form therein a wire lead-out part of which the long side is in the film traveling direction, from the viewpoint of attaining the blanking operation with accuracy.

(Blanking)

Figure 2:
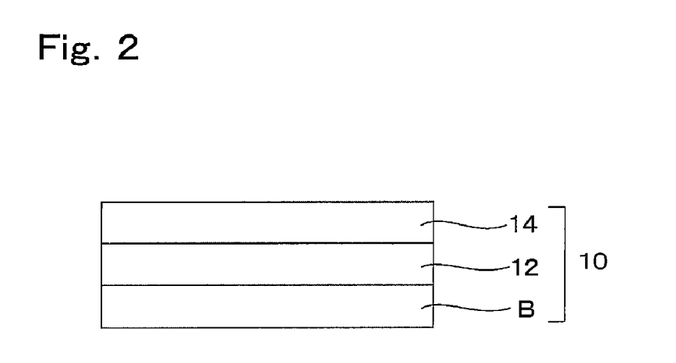
FIG. 2 is a schematic view showing the cross section of the film composite for use in FIG. 1.
Figure 3:
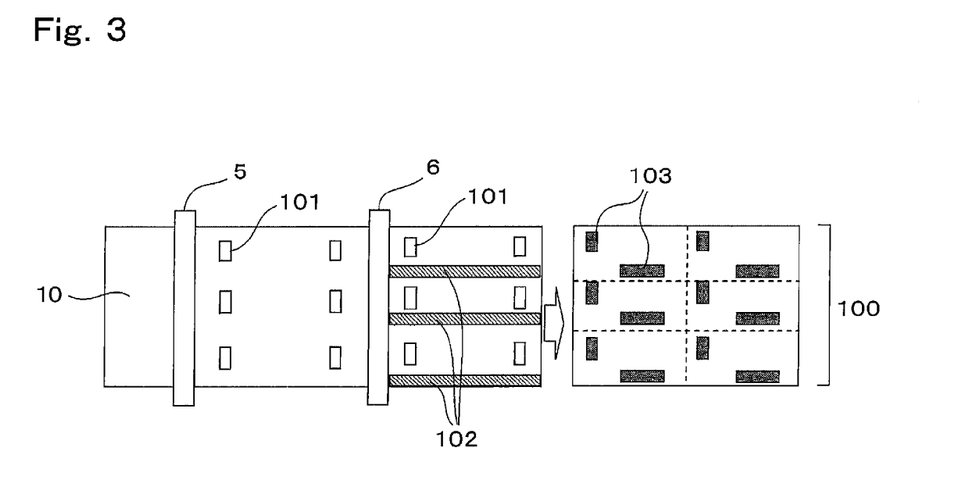
FIG. 3 is a schematic view showing a gas barrier film in one embodiment of the method for bonding a gas barrier film and an electronic device of the invention, and an environment-sensitive device array produced from it, as seen in the film normal direction.

For the blanking operation in the invention, preferably employed is any blanking method in ordinary film working. The gas barrier film to be processed is nipped between two molds of a punch and a die, and the punch is made to run through the film to pierce a hole in a predetermined site of the film. Regarding the punch and the die, the opening of the die is designed to have a given shape of a hole to be blanked, and the punch and the die are so arranged that they have a given clearance therebetween. The punch and the die are combined with a high degree of accuracy, and the distance between the punch diameter and the die opening hole diameter (one side clearance) is, in general, preferably from 1 μm to 4 μm; however, the blanking operation is possible even without the range. Concretely, the method described in JP-A 2005-183501 is preferably employed. A large number of punches and dies may be formed in one mold unit, and the pitch between the punches, the pitch between the die opening holes, the punch diameter and the die opening hole diameter are finished with a high degree of accuracy. Further after blanking by punching, the blanked slag must be smoothly removed. Various methods have been proposed for slag removal, including, for example, a method of forming an air introduction nozzle on the side of the die and discharging out the blanked slag through air blowing under pressure (JP-A 11'-33997, pp. 2-3, FIGS. 1-3); and a discharging method based on the vacuum difference by blower suction as in JP-A 11-58297 (p. 3, FIGS. 1-4) and others; and these methods are favorably employed here.

In the method of the present invention, the blanking operation is attained by introducing a punch into the film composite from the side of the gas barrier film thereof, from the viewpoint of preventing the gas barrier surface having resin melt discharge or burr.

(Slitting)

Figure 4:
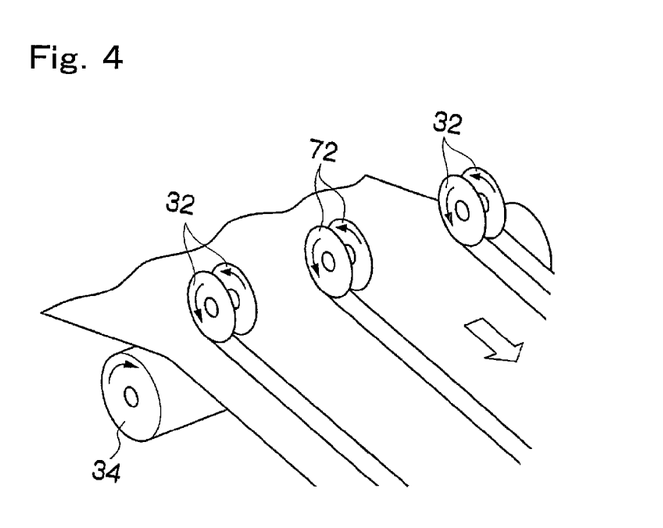
FIG. 4 is a schematic view showing the constitution of a slitting unit

FIG. 4 is a perspective view schematically showing the constitution of the slitting unit 6 for use in the invention. The slitting unit 6 of the embodiment illustrated in the drawing is a unit for cutting one sheet of a film composite 10 to give plural finished devices. Specifically, the slitting unit 30 is provided with center cutting rotary blades 72 and 72. The center cutting rotary blades 72 and 72 are arranged in parallel to each other via a given distance therebetween. Like the rotary blade 32, preferably, the rotaryblade 72 is rotated in the running direction of the film composite 10 and at a speed of from 3 to 5 times the running speed of the film composite.

Figure 5:
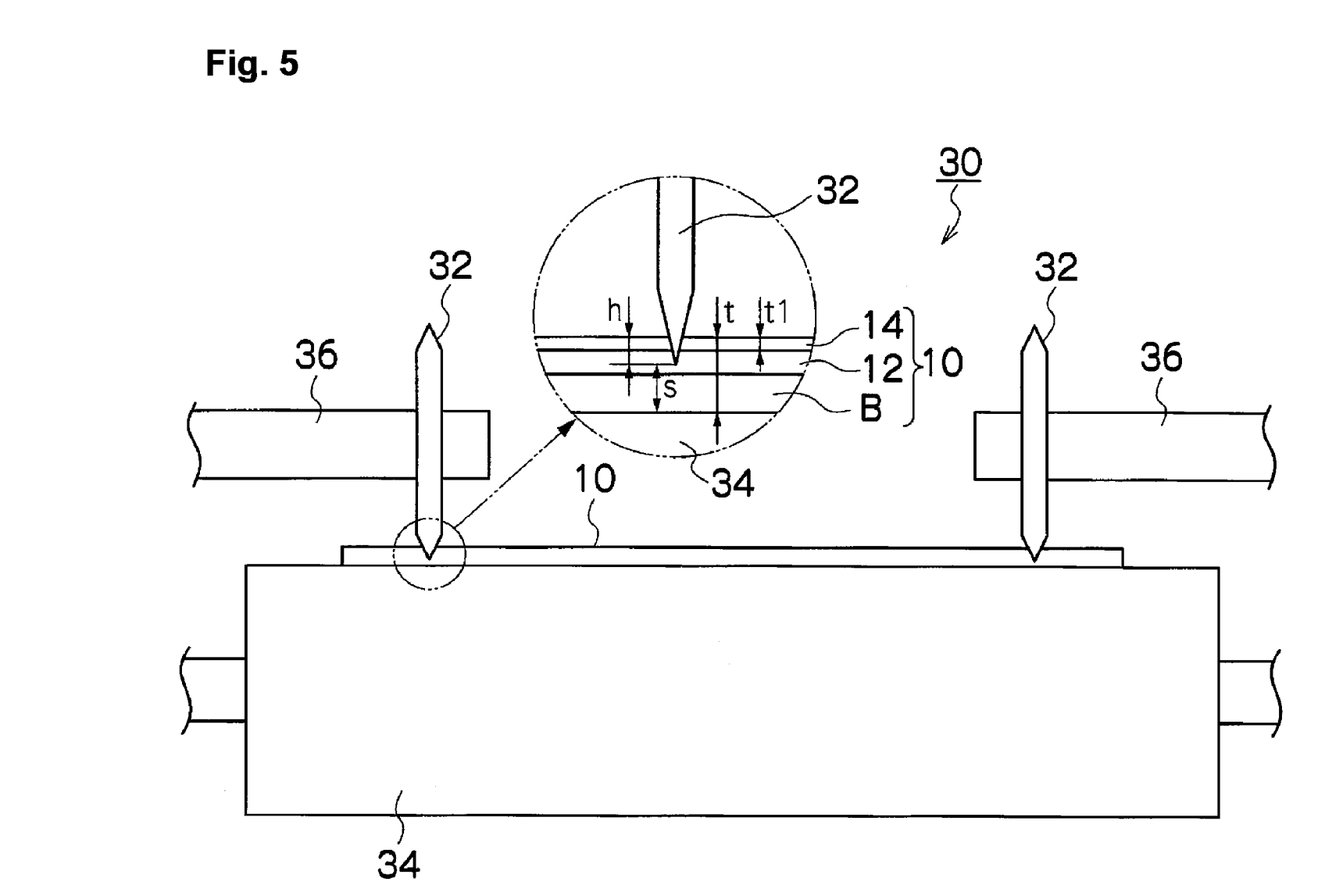
FIG. 5 is a schematic view showing the cross section of a film composite in a slitting unit in which the film composite is partially slit in the thickness direction thereof.

In FIG. 5, rotary blades 32 and 72 are used as the means for mechanically cutting the film composite 10; however, the mechanical cutting means is not limited to these, and for example, the gas barrier film 14 of the film composite 10 may be scraped off with a sharp-set pin.

As in FIG. 5, one embodiment of the slitting unit 30 comprises mainly rotary blades 32 and a backup roller 34. The backup roller 34 is cylindrical, and is rotatably supported by the apparatus body (not shown). The film composite 10 is wound around the backup roller 34 at a given lap angle and in such a manner that the support side of the gas barrier film 14 could face outside. Preferably, the backup roller 34 is rotated in the running direction of the film composite 10 and at the same speed as the running speed of the film composite 10.

The rotary blade 32 is formed to have a thin disc-like shape, and via the shaft 36, this is rotatably supported by the apparatus body (not shown). Preferably, the rotary blade 32 is so designed that the angle α of its tip (that is, the outer peripheral part) is an acute angle of from 20 to 85°; and the tip is arranged at a given space "s" from the backup roller. The space "s" is preferably so set as to be smaller than the thickness "t" of the film composite 10. Accordingly, when the film composite 10 is led to pass between the rotary blade 32 and the backup roller 34, the film composite 10 is partially cut from the support side of the gas barrier film 14, thereby forming a groove on the support side of the gas barrier film 14 of the film composite 10.

Preferably, the above-mentioned space "s" is controlled in accordance with the thickness "t" of the film composite 10 and the thickness "t1" of the gas barrier film 14, and more preferably, this is so controlled that the cutting depth "h" (=t−s)" by the rotary blade 32 could be from "t1" to "t/2". When the cutting depth "h" is controlled to be at most "t/2", then the protective film B may be prevented from greatly deforming in cutting the film composite 10, and the gas barrier film 14 may be thereby prevented from cracking. When the cutting depth "h" is controlled to be at least "t1", the gas barrier film 14 can be completely cut with the rotary blade 32.

The rotary blade 32 is connected to a non-shown rotation drive source and is driven in rotation in the running direction of the film composite 10. In this case, the rotating speed of the rotary blade 32 is preferably from 3 to 5 times the running speed of the film composite 10. When the rotating speed of the rotary blade 32 is at least 3 times, then the hard thin film, gas barrier film 14 can be surely cut. When the rotating speed of the rotary blade 32 is at most 5 times the running speed of the film composite 10, then the cutting accuracy may be prevented from lowering owing to the moving fluctuation of the cutting blade 32.

Preferably in the method of the invention, the blade is introduced into the film composite from the gas barrier film side thereof to thereby partially slit the film composite in the thickness direction thereof. In other words, it is desirable that the film composite 10 is partially cut in the thickness direction thereof by the slitting unit 30. Specifically, the rotary blade 32 of the slitting unit 30 is pressed to the gas barrier film 14 of the film composite 10, and the film composite 10 is thereby partially cut from the side of the gas barrier film 14, and a slit is thereby formed on the side of the gas barrier film 14.

According to this embodiment as above, the film composite 10 is cut by the rotary blade 32 partially in the thickness direction thereof from the side of the gas barrier film 14, and therefore, the gas barrier film 14 is collected in the unnecessary gas barrier film winding unit 7 while the protective film is kept remaining until the protective film winding unit 8 that is preferably arranged downstream the system. Accordingly, after the slitting operation and before the protective film winding unit 8, the film composite can be stably conveyed even though it is slit in the part to be wound off of the gas barrier film 102.

In case where the film composite 10 is partially cut by the mechanical cutting means, rotary blade 32, it may be prevented from being deformed or degraded unlike that in a case of cutting it with a laser.

In the method of the invention, preferably, the film composite is slit by introducing a blade thereinto from the side of the gas barrier film, from the viewpoint of preventing the gas barrier surface having resin melt discharge or burr.

<Removal Step>

Preferably, the method of the invention includes removing the blanked and/or slit part of the gas barrier film of the film composite prior to the roll-bonding step, from the viewpoint of preventing the gas barrier film from remaining in the wire lead-out part on the substrate having an electronic device formed thereon. Especially in case where the film composite is slit partially in the thickness direction thereof, the protective film remains below the part corresponding to the blanked and/or slit part of the gas barrier film of the film composite, and therefore the gas barrier film can be readily removed in this embodiment.

Preferably, the method of the invention includes a film composite protective film removing step from after the wire lead-out part forming step to before the roll-bonding step, from the viewpoint of physically protecting the gas barrier film and the adhesive layer during the wire lead-out part forming step. Removing the protective film makes it possible to overlay the adhesive layer on the electronic device-mounted substrate during the roll-bonding step to be described below.

The film composite protective film removing step is preferably just before the roll-bonding step from the viewpoint of keeping the gas barrier film as long as possible especially when the film composite is slit partially in the thickness direction thereof.

<Roll-Bonding Step>

The method of the invention includes continuously roll-bonding the film composite processed to form a wire lead-out part therein to a substrate with an electronic device formed thereon.

Not contradictory to the scope and the spirit of the invention, the roll is not specifically defined, and for example, the roll described in JP-A 2004-107057 can be used here. The roll described in the patent reference is constituted by lining the surface of a metallic roll body of SS, SUS or the like with a surface material such as NBR rubber or the like. Changing the surface material makes it possible to control the hardness of the roll surface, therefore making it possible to prevent the device from being broken by pressure in the roll-bonding step. Adding an additive to the surface material makes it possible, for example, to prevent the film modified to have an antistatic function from being contaminated with impurities during bonding it to a substrate or to reduce the damage of the device owing to static elasticity.

In the method of the invention, the electronic device is preferably an organic EL device.

<In-Line Bonding>

In the method of the invention, the film composite feeding step, the wire lead-out part forming step and the roll-bonding step are carried out through in-line operation. The in-line operation enables the simple and high-efficiency bonding method for a gas barrier film and an electronic device.

[Production Method for Electronic Device]

The method for producing an electronic device of the invention comprises curing the adhesive layer after the method of bonding a gas barrier film and an electronic device as above.

The step of curing the adhesive layer may be suitably modified depending on the type of the adhesive used; and in case where a thermosetting adhesive is used, the layer may be cured by heating. In case where a photocurable adhesive is used, the layer may be cured through photoirradiation.

The method for producing an electronic device of the invention preferably includes dividing the electronic device array produced according to the electronic device array production method to be described below.

The step of dividing the electronic device array is not specifically defined, for which, for example, any known substrate cutting method is employable.

[Method for Producing Electronic Device Array]

The method for producing an electronic device array of the invention includes curing the adhesive layer after the method of bonding a gas barrier film and an electronic device as above. In the production method for an electronic device array of the invention, for example, the slitting unit shown in FIG. 4 is preferably used.

[Electronic Device]

The electronic device of the invention is one produced according to the electronic device production method of the invention.

Application examples of the invention are described below.
(Electronic Device)

The electronic device of the invention includes an organic EL device, a liquid-crystal display device, a thin-film transistor, a touch panel, an electronic paper, a solar cell, etc.
(Organic EL Device)

Examples of an organic EL device comprising a gas barrier film are described in detail in JP-A 2007-30387.
(Liquid-Crystal Display Device)

For the liquid-crystal display device, reference may be made to the description in the paragraph [0044] in JP-A 2009-172993.

(Solar Cell)

The gas barrier film in the invention may be used as a sealing film for a solar cell device. Preferably, the gas barrier film in the invention is applied to a solar cell device in such a manner that the adhesive layer thereof is adjacent to the device. Not specifically defined, the solar cell device to which the gas barrier film is favorably applied includes, for example, a monocrystalline silicon-based solar cell device, a polycrystalline silicon-based solar cell device, a single-bonding or tandem-structured amorphous silicon-based solar cell device, a gallium/arsenic (GaAs), indium/tin (InP) or the like III-V Group compound semiconductor-based solar cell device, a cadmium/tellurium (CdTe) or the like II-VI Group compound semiconductor-based solar cell device, a copper/indium/selenium (CIS)-based, copper/indium/gallium/selenium (CIGS)-based, copper/indium/gallium/selenium/sulfur (CIGSS)-based or the like I-III-VI Group compound semiconductor-based solar cell device, a dye-sensitized solar cell device, an organic solar cell device, etc. Above all, in the invention, the solar cell device is preferably a copper/indium/selenium (CIS)-based, copper/indium/gallium/selenium (CIGS)-based, copper/indium/gallium/selenium/sulfur (CIGSS)-based or the like I-III-VI Group compound semiconductor-based solar cell device.

(Electronic Paper)

The gas barrier film in the invention is applicable to an electronic paper. The electronic paper is a reflection-type electronic display and can realize high-precision and high-contrast ratio images.

The electronic paper has a display medium and a TFT for driving the display medium on a substrate. The display medium may be any known conventional display medium. For example, any display medium including an electrophoresis-type, electronic powdery particles-flying type, a charging toner-type, an electrochromic type or the like display medium is favorably used here; however, an electrophoresis-type display medium is more preferred, and a microcapsule electrophoresis-type display medium is even more preferred. The electrophoresis-type display medium is a display medium including plural capsules, in which the plural capsules individually at least one particle capable of moving in a suspension fluid. At least one particle is preferably an electrophoretic particle or a rotary ball. The electrophoresis-type display medium has a first face and a second face arranged opposite to the first face, and this medium displays a visual image via one face of the first and second faces.

The TFT to be arranged on the substrate has at least a gate electrode, a gate insulating film, an active layer, a source electrode and a drain electrode, and further has a resistance layer electrically connecting to at least one between the active layer and the source electrode or between the active layer and the drain electrode. The electronic paper produces light shading through voltage application thereto.

In case where an electronic display for high-definition color images is produced, preferably, a color filter is formed on TFT for securing the alignment accuracy. However, even through the necessary drive current is desired to be obtained by the use of an ordinary TFT having a low current efficiency, the downsizing is limited, and therefore, the area for TFT in the pixel may increase with the increase in the definition level of the display medium. When the area for TFT in the pixel increases, then the aperture is reduced and the contrast ratio is thereby lowered. Accordingly, even when a transparent amorphous IGZO-type TFT is used, the light transmittance could not be 100% and the contrast reduction may be inevitable. In that situation, for example, the TFT described in JP-A 2009-021554 may be used for reducing the area for TFT inside the pixel to thereby increase the aperture and the contrast ratio. When the TFT of the type is formed directly on a color filter, then the device may realize high-definition image display.

(Others)

As other application examples, there may be mentioned thin-film transistors as in JP-T 10-512104, touch panels as in JP-A 5-127822, 2002-48913, etc.

EXAMPLES

The present invention will be further specifically explained with reference to the following examples of the present invention. The materials, amounts, ratios, types and procedures of treatments and so forth shown in the following examples can be suitably changed unless such changes depart from the gist of the present invention. Accordingly, the scope of the present invention should not be construed as limited to the following specific examples.

Production Example 1

Formation of Gas Barrier Film

According to the description in the paragraphs [0047] to in JP-A 2009-172988, a gas barrier film of Example 13 in the paragraph [0050] was formed.

Formation of Protective Film:

A mixture of 15 parts by weight of a curable silicone emulsion (Shin-etsu Chemical's trade name, KM768), 0.75 parts by weight of a curing agent (Shin-etsu Chemical's trade name, CAT-PM10A) and 120 parts by weight of ion-exchanged water was uniformly stirred. Using a bar coater, the mixture was applied onto the easy adhesion layer-coated surface of a PET film (Toray's trade name Lumirror) in a dry thickness of 0.5 μm, and dried at 160° C. for 1 minute to form a protective film.

Coating with Adhesive Layer:

A two-pack thermosetting adhesive (Daizo Nichimori's trade name, Epotec 310) was applied onto a release film in a thickness of 5 μm, and this was transferred onto the barrier film prepared in the above, thereby forming an adhesive layer on the film.

Bonding:

The gas barrier film (with adhesive layer) and the protective film prepared in the above were bonded under pressure using a rubber roller, without introducing air bubbles between the two.

Example 1

Figure 1:
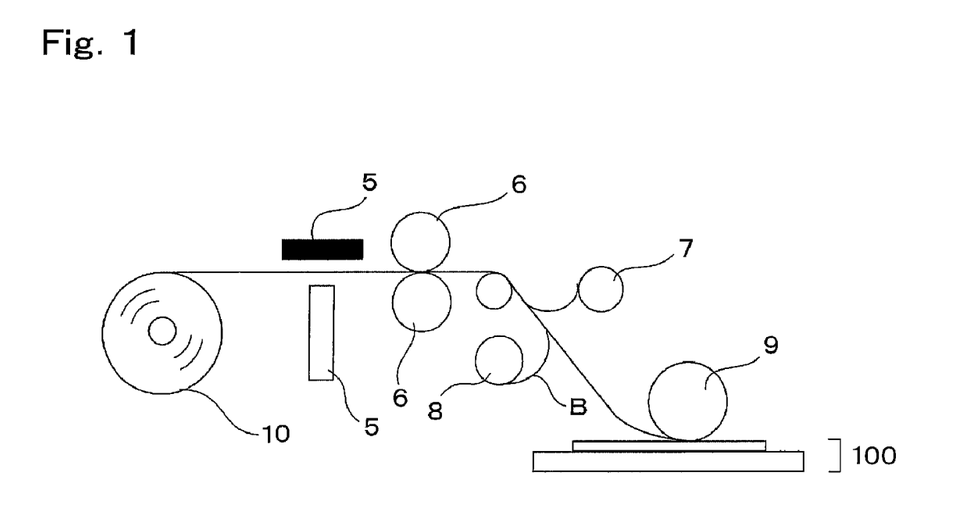
FIG. 1 is one preferred embodiment of the method for bonding a gas barrier film and an electronic device of the invention.

Using the apparatus shown in FIG. 1, the gas barrier film and the electronic device were bonded through in-line operation. The slitting unit 6 in the apparatus of FIG. 1 has the constitution of FIG. 4.

Concretely, a roll film composite 1 having a width of 30 cm in the direction perpendicular to the film traveling direction was continuously fed into the blanking unit 5. This was forcedly introduced into the unit and blanked therein in such a manner that the size of each hole 101 could be 1 cm×2 cm (film traveling direction×direction perpendicular to the film traveling direction—the same shall apply hereinunder). In this, the punch in the blanking unit 5 was made to run through the film composite 10 from the side of the gas barrier film 14 thereof and the distance between the punch diameter of the punch and the hole diameter of the die opening (one side clearance) was controlled to be 3 μm. Subsequently, this was slit in the slitting unit 6 in such a manner that the slit width could be 1 cm at intervals of 10 cm width in the film traveling direction, in which the cutting blades each having an edge angle of 60° were pressed to the film composite 10 from the side of the gas barrier film 14 thereof. In this, the slitting operation was so controlled that from the gas barrier film 14 to the inside of the protective film B could be cut in order that only the gas barrier film 14 and the adhesive layer 12 of the film composite 10 could be peeled but while the protective film was kept as such without being completely cut in the direction perpendicular to the film traveling direction; and in that condition, the film composite 10 was conveyed toward the downward direction.

The holes 101 and the slits were in three sites each in the direction perpendicular to the film traveling direction of the film composite 10.

Of the thus-slit film composite, the part to be wound off of the gas barrier film 102 was continuously removed in the unnecessary gas barrier film winding unit 7. The protective film B of the film composite 10 was continuously removed in the protective film winding unit 8 just before the gas barrier film bonding roll 9.

After the protective film was removed, the gas barrier film 14 in the part of the film composite 10 from which the part to be wound off 102 had been removed was continuously stuck to a substrate of an organic EL device 100 via the adhesive layer 12, using a gas barrier film bonding roll 9 described in Example 1 in JP-A 2004-107057, and then this was cured under heat at 65° C. for 3 hours.

Thus produced, the organic EL device did not have the gas barrier film 14 in the wire lead-out part 103. It was confirmed that any unnecessary gas barrier film remained in the site except the wire lead-out part 103 corresponding to the slit part to be wound off 102.

The thus-sealed, organic EL device array was cut with a laser cutter into individual organic EL devices.

Example 2

In the same manner as in Example 1, a gas barrier film 14 was bonded to a substrate of an organic EL array 100; however, in this, the film composite 10 was slit completely from the gas barrier film 14 to the protective film B thereof so that the gas barrier film 14, the adhesive layer 12 and the protective layer B could be all peeled off.

(Evaluation)

In Examples 1 and 2, the samples were checked for bonding misalignment of the hole 101 and the slit part to be wound off 102 relative to the wire lead-out part 103. In addition, the obtained organic EL devices were evaluated in the manner mentioned below. 10 test pieces were tested in every evaluation test. The evaluation results are shown in Table 1.

<Evaluation Standard for Bonding Alignment>
A: Misalignment was within 1 mm.
B: Misalignment was from 1 to 2 mm.
C: Misalignment was from 2 to 5 mm.
D: Misalignment was more than 5 mm, or misalignment stepped over the wire lead-out parts in bonding.

(Evaluation of Light-Emitting Surface Condition of Organic EL Device)

Using a source measure unit, Keithley's SMU2400 Model, the organic EL device just after production was driven to emit light by applying a voltage of 7 V thereto. Using a microscope, the light-emitting surface condition was observed, and it was confirmed that the devices of Examples 1 and 2 all emitted uniform light with no dark spot.

Next, the devices were left in a dark room at 60° C. and at a relative humidity of 90% for 500 hours, and then the light-emitting surface condition thereof was checked. The number of the devices that gave dark spots having a larger diameter than 300 μm was taken as a failure rate, and the tested devices was evaluated based on it.

TABLE 1

|  | Hole 101 | Slit Part to be Wound off 102 | Failure Rate of Organic EL Device (%) |
| --- | --- | --- | --- |
| Example 1 | A | A | 5% or less |
| Example 2 | B | B | 5% or less |

From the above, it is known that the methods of Examples are both simple and realize high production efficiency not damaging the continuously fed gas barrier film.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 216706/2009, filed on Sep. 18, 2009, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A method for bonding a gas barrier film and an electronic device, comprising:
    continuously feeding a film composite that contains a gas barrier film having a support and a gas barrier layer, and an adhesive layer,
    blanking or slitting a part of the thus continuously fed film composite to form a wire lead-out part therein, and
    continuously roll-bonding the film composite thus processed to form the wire lead-out part therein to a substrate with an electronic device formed thereon,
    wherein the feeding of the film composite, the forming of the wire lead-out part and the roll-bonding are carried out through in-line operation.

2. The method for bonding a gas barrier film and an electronic device according to claim 1, wherein the film composite is blanked or slit plural times in the direction perpendicular to the film traveling direction.

3. The method for bonding a gas barrier film and an electronic device according to claim 1, wherein the electronic device is an organic EL device.

4. The method for bonding a gas barrier film and an electronic device according to claim 1, wherein blanking the continuously fed film composite and then slitting the blanked film composite.

5. The method for bonding a gas barrier film and an electronic device according to claim 1, wherein blanking the continuously fed film composite to form therein the wire lead-out part of which the long side is in the direction perpendicular to the film traveling direction is followed by slitting the film composite to form therein the wire lead-out part of which the long side is in the film traveling direction.

6. The method for bonding a gas barrier film and an electronic device according to claim 1, wherein the film composite is blanked or slit by introducing a cutting blade thereinto from the side of the gas barrier film of the film composite.

7. The method for bonding a gas barrier film and an electronic device according to claim 1, comprising removing the blanked or slit part of the gas barrier film of the film composite prior to the roll-bonding.

8. The method for bonding a gas barrier film and an electronic device according to claim 1, wherein the film composite is continuously fed from a roll film composite.

9. The method for bonding a gas barrier film and an electronic device according to claim 1, wherein the gas barrier film has a laminate structure of at least one organic layer and at least one inorganic structure alternately laminated on one surface of the support of a thermoplastic resin.

10. The method for bonding a gas barrier film and an electronic device according to claim 1, wherein the film composite further contains a protective film, and the gas barrier film, the adhesive layer and the protective film are laminated in that order.

11. The method for bonding a gas barrier film and an electronic device according to claim 10, wherein the film composite is partially slit by introducing a cutting blade thereinto from the side of the gas barrier film of the film composite to reach the inside of the protective film.

12. The method for bonding a gas barrier film and an electronic device according to claim 11, comprising removing the film composite protective film after forming the wire lead-out part and prior to the roll-bonding.

13. The method for bonding a gas barrier film and an electronic device according to claim 12, wherein the film composite protective film is removed just before the roll-bonding.

14. The method for bonding a gas barrier film and an electronic device according to claim 1, comprising curing the adhesive layer after the roll-bonding.

15. The method for bonding a gas barrier film and an electronic device according to claim 14, wherein the adhesive layer is cured by heating.

16. A method for producing an electronic device array, comprising:
    continuously feeding a film composite that contains a gas barrier film having a support and a gas barrier layer, and an adhesive layer,
    blanking or slitting a part of the thus continuously fed film composite to form a wire lead-out part therein,
    continuously roll-bonding the film composite thus processed to form the wire lead-out part therein to a substrate with a plural number of electronic devices formed thereon, and
    curing the adhesive layer,
    wherein the feeding of the film composite, the forming of the wire lead-out part and the roll-bonding are carried out through in-line operation.

17. A method for producing an electronic device, comprising:
    continuously feeding a film composite that contains a gas barrier film having a support and a gas barrier layer, and an adhesive layer,
    blanking or slitting a part of the thus continuously fed film composite to form a wire lead-out part therein,
    continuously roll-bonding the film composite thus processed to form the wire lead-out part therein to a substrate with an electronic device formed thereon, and
    curing the adhesive layer,
    wherein the feeding of the film composite, the forming of the wire lead-out part and the roll-bonding are carried out through in-line operation.

18. The method for producing an electronic device according to claim 17, wherein the substrate has a plural number of electronic devices formed thereon and an electronic device array is produced after the curing of the adhesive layer, and the method further comprises cutting the electronic device array into individual electronic devices.

* * * * *